(12) United States Patent
Lu et al.

(10) Patent No.: US 9,608,604 B2
(45) Date of Patent: Mar. 28, 2017

(54) VOLTAGE LEVEL SHIFTER WITH SINGLE WELL VOLTAGE

(75) Inventors: Lee-Chung Lu, Taipei (TW);
Chung-Hsing Wang, Baoshan Township, Hsinchu County (TW);
Chun-Hui Tai, HsinChu (TW);
Li-Chun Tien, Tainan (TW); Shun-Li Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1158 days.

(21) Appl. No.: 11/639,006

(22) Filed: Dec. 14, 2006

(65) Prior Publication Data

US 2008/0143418 A1    Jun. 19, 2008

(51) Int. Cl.
*H03L 5/00* (2006.01)
*H03K 3/356* (2006.01)

(52) U.S. Cl.
CPC ................................ *H03K 3/35613* (2013.01)

(58) Field of Classification Search
CPC ..... G06F 3/00; G06F 3/1295; H03K 19/0175; H03K 5/003
USPC ........................ 327/333; 326/63, 68, 80, 81
See application file for complete search history.

(56) References Cited

U.S. PATENT DOCUMENTS

| 7,112,997 B1* | 9/2006 | Liang et al. ............... 326/81 |
| 2004/0012397 A1* | 1/2004 | Mizuno et al. ............ 324/522 |
| 2005/0046449 A1* | 3/2005 | Davis ........................ 327/112 |

FOREIGN PATENT DOCUMENTS

| CN | 1369969 A | 9/2002 |
| JP | 2001223575 A | 8/2001 |

OTHER PUBLICATIONS

Kang, Sung-Mo, et al. CMOS Digital Integrated Circuits: Analysis and Design. McGraw-Hill, $3^{rd}$ Ed., p. 496.*
CN Office Action 200710181912.3 dated Jan. 8, 2010.

* cited by examiner

*Primary Examiner* — Lincoln Donovan
*Assistant Examiner* — Diana J Cheng
(74) *Attorney, Agent, or Firm* — Haynes and Boone, LLP

(57) ABSTRACT

This invention discloses a voltage level shifter, which comprises a first P-type metal-oxide-semiconductor (PMOS) transistor having a gate, a source and a bulk coupled to an input terminal, a first positive voltage power supply and a second positive voltage power supply, respectively, and a second PMOS transistor having a source, a drain and a bulk coupled to a third positive voltage power supply, an output node and the second positive voltage power supply, respectively, wherein the first and second PMOS transistors are formed in a single Nwell.

8 Claims, 3 Drawing Sheets

VOLTAGE LEVEL SHIFTER WITH SINGLE WELL VOLTAGE

BACKGROUND

The present invention relates generally to integrated circuit (IC) designs, and, more particularly, to voltage level shifter designs.

As semiconductor feature sizes scale down to a deep submicron region, their operation voltages also have to scale down. For instance, in a 65 nm process technology, the operation voltage is around 1.0V. But outside such a chip, i.e., in the system level, the operation voltage may still remain, for example, 1.8V. Then a need for voltage level shifters arises. A high-to-low voltage level shifter transfers input signals from 1.8V to 1.0V for chip internal operations. A low-to-high voltage level shifter transfers output signals from 1.0V to 1.8V for system operations.

A conventional voltage level shifter employs two stage complementary metal-oxide-semiconductor (CMOS) circuits, with a first stage operating at a first voltage, and a second stage operating at a second voltage. When their threshold voltages are properly adjusted, they can perform voltage level shifting as desired.

However, the conventional voltage level shifter may occupy large layout areas. Because a first Nwell for a P-type metal-oxide-semiconductor (PMOS) transistor in the first stage is coupled to a first voltage, while a second Nwell for a PMOS transistor in the second state inverter is coupled to a second voltage, therefore, the first and second Nwells have to be separated and have to maintain a certain distance, which is determined by the technology being used. Two separated Nwells certainly occupy a larger layout area than a single Nwell.

As such, what is desired is a voltage level shifter with a Nwell coupled to a single voltage, and hence both first and second PMOS transistors may be formed in a single Nwell.

SUMMARY

This invention discloses a voltage level shifter. According to one embodiment of the present invention, the voltage level shifter comprises a first P-type metal-oxide-semiconductor (PMOS) transistor having a gate, a source and a bulk coupled to an input terminal, a first positive voltage power supply and a second positive voltage power supply, respectively, and a second PMOS transistor having a drain coupled to an output node, and both a source and a bulk coupled to the second positive voltage power supply, wherein the first and second PMOS transistors are formed in a single Nwell.

According to another embodiment of the present invention, the voltage level shifter comprises a first P-type metal-oxide-semiconductor (PMOS) transistor having a gate coupled to an input terminal, and both a source and a bulk coupled to a first positive voltage power supply, and a second PMOS transistor having a source, a drain and a bulk coupled to a second positive voltage power supply, an output node and the first positive voltage power supply, respectively, wherein the first and second PMOS transistors are formed in a single Nwell.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The present invention discloses a voltage level shifter employing just one Nwell voltage.

Figure 1:
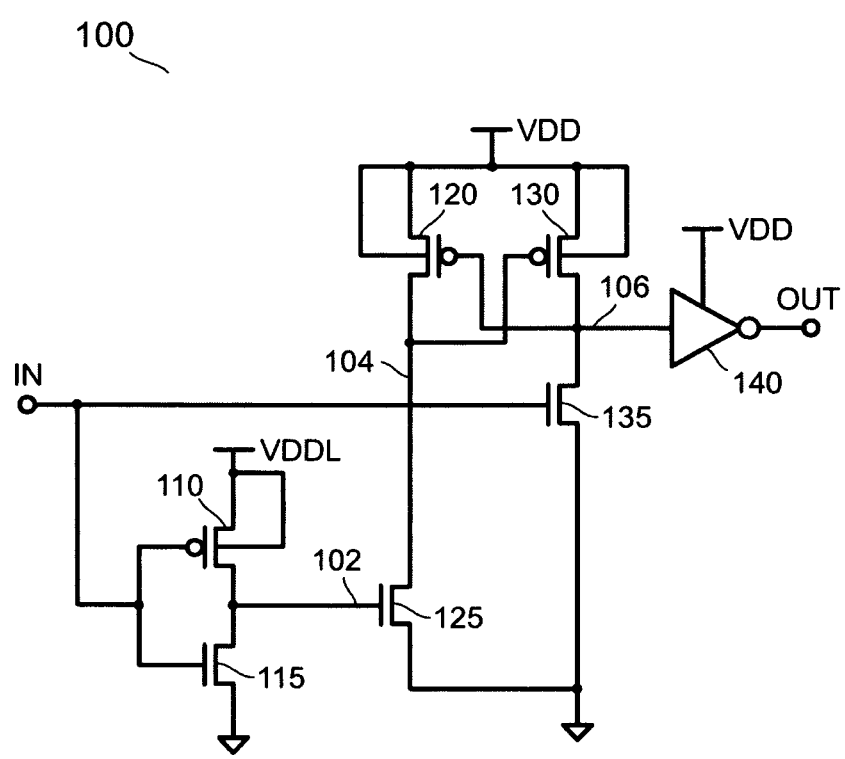
FIG. 1 is a schematic diagram illustrating a conventional low-to-high voltage level shifter.

FIG. 1 is a schematic diagram illustrating a conventional low-to-high voltage level shifter 100. An input terminal IN is coupled to an input of an inverter formed by a P-type metal-oxide-semiconductor (PMOS) transistor 110 and an N-type metal-oxide-semiconductor (NMOS) transistor 115. An output of the inverter is coupled to a gate of an NMOS transistor 125 at a node 102. The input terminal IN is also coupled to a gate of an NMOS transistor 135. A drain of the NMOS transistor 125 is coupled to a drain of a PMOS transistor 120 at a node 104. A drain of the NMOS transistor 135 is coupled to a drain of a PMOS transistor 130 at a node 106. A gate of the PMOS transistor 120 is cross-coupled to node 106, and similarly, a gate of the PMOS transistor 130 is cross-coupled to node 104. An input and output terminal of an inverter 140 is coupled between node 106 and an output terminal OUT. Note that a drain and a bulk of the PMOS transistor 110 are coupled to a first positive voltage power supply (VDDL), and drains and bulks of both the PMOS transistors 120 and 130 are coupled to a second positive voltage power supply (VDD). VDD is also supplied to the inverter 140. VDDL is for a chip internal operation, and relatively lower than VDD, which is for the chip external operation. Therefore, voltage levels at the input terminal IN and the output terminal OUT are VDDL and VDD, respectively. Sources of all the NMOS transistors are coupled to a complementary low voltage power supply (VSS).

Referring to FIG. 1, when the input terminal IN is at the VDDL voltage, the NMOS transistor 135 is on, hence node 106 is at the VSS voltage, and the PMOS 120 is also on. At the same time, node 102 is pulled down to the VSS voltage, hence node 104 is at the VDD voltage, which in turn, shuts off the PMOS transistor 130, and re-enforces the Vss voltage at node 106. Then the output terminal OUT is at the VDD voltage. Therefore, the VDDL voltage level at IN is shifted to the VDD voltage level at OUT.

On the other hand, when the input terminal IN is at the Vss voltage, the NMOS transistor 135 is off, and the NMOS transistor 125 is on. The PMOS transistor 120 is off, and the PMOS transistor 130 is on. As a result, node 104 is at VSS voltage, and node 106 is at the VDD voltage level, so that the output terminal OUT is at VSS voltage. Therefore, the voltage level shifter 100 works in both high and low input voltages.

A problem with the conventional voltage level shifter 100 is that the bulk of the PMOS transistor 110 is coupled to the VDDL voltage, while the bulk of the PMOS transistors 120 and 130 are coupled to the VDD voltage, i.e., a first Nwell for the PMOS transistor 110 and a second Nwell for the PMOS transistors 120 and 130 have different voltages, therefore, they must be separated and maintain a predetermined distance under a certain design rule. Separated Nwells often require two-tiered Nwell layouts and hence occupy a larger layout area than a single Nwell layout.

Figure 2:
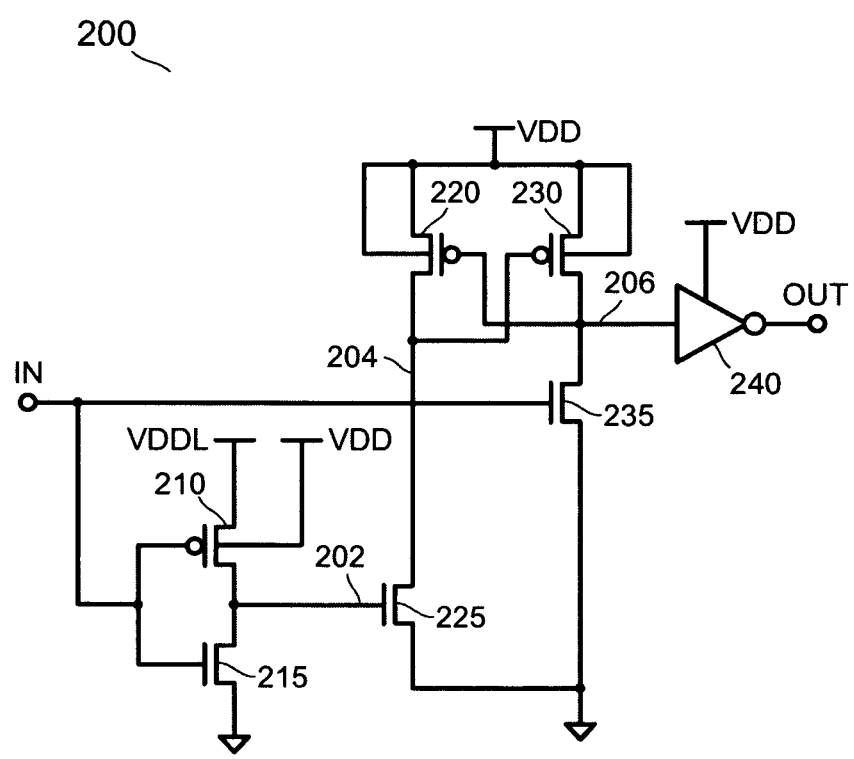
FIG. 2 is a schematic diagram illustrating a low-to-high voltage level shifter according to an embodiment of the present invention.

FIG. 2 is a schematic diagram illustrating a low-to-high voltage level shifter 200 according to an embodiment of the present invention. The circuit construction of the voltage level shifter 200 is exactly the same as that of the voltage level shifter 100 shown in FIG. 1, except that a bulk of a PMOS transistor 210 is coupled to the VDD voltage, instead of the VDDL voltage. As VDD voltage is higher than the VDDL voltage, a threshold voltage (Vt) of the PMOS transistor 210 increases as a result, which will affect a threshold voltage of an inverter formed by the PMOS transistor 210 and a NMOS transistor 215, and hence the inverter transition speed. But with proper adjustments of the transistor Vt implants as well as the sizes of the PMOS transistor 210 and the NMOS transistor 215, the threshold of the inverter can be brought back to a normal range. Then the voltage level shifter 200 operates exactly the same as the voltage level shifter 100 shown in FIG. 1, and it requires no further discussion here.

Because only one voltage level is employed for picking up the bulks of the PMOS transistors 210, 220 and 230, only one Nwell is needed, hence the layout area for the voltage level shifter 200 can be reduced to as much as 50%.

Figure 3:
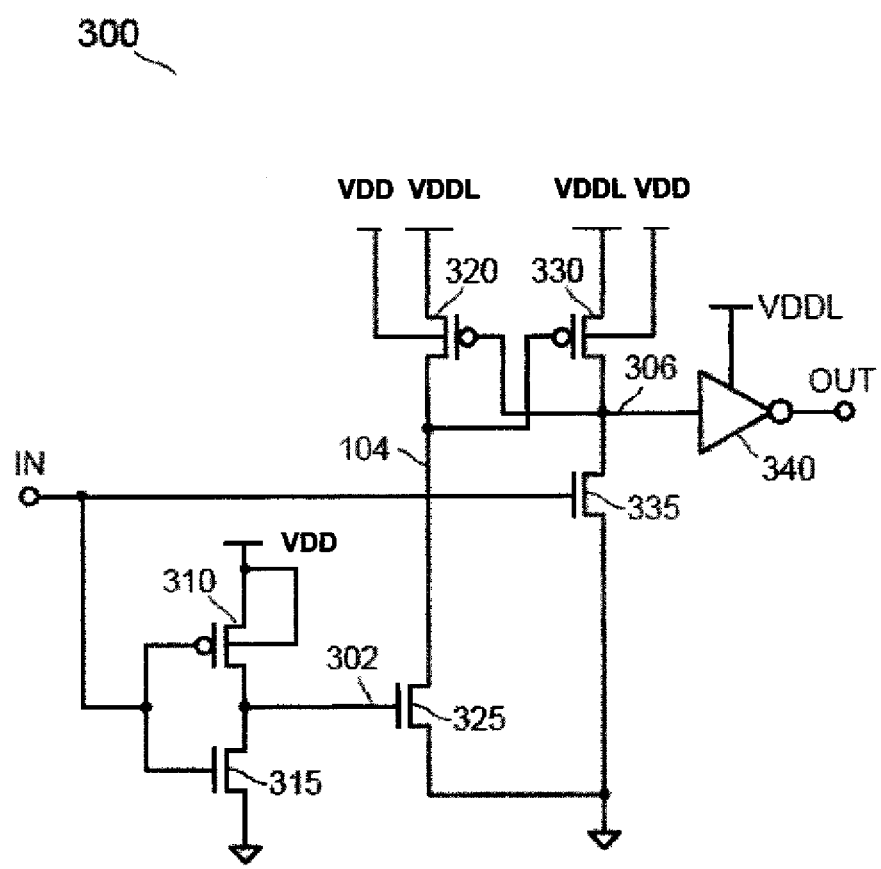
FIG. 3 is a schematic diagram illustrating a high-to-low voltage level shifter according to another embodiment of the present invention.

FIG. 3 is a schematic diagram illustrating a high-to-low voltage level shifter 300 according to another embodiment of the present invention. Again the circuit construction of the voltage level shifter 300 is exactly the same as the voltage level shifter 100 shown in FIG. 1, except that a source of a PMOS transistor coupled to the input terminal IN is coupled to the VDD voltage, while sources of the PMOS transistors 320 are 330 closer to the output terminal OUT is coupled to the VDDL voltage, and an inverter 340 is also supplied with the VDDL voltage, so that the voltage is shifted from high to low by the voltage level shifter 300.

Referring to FIG. 3, bulks of the PMOS transistors 320 and 330 are coupled to the VDD voltage supply according to the embodiment of the present invention, while sources of the PMOS transistor 320 and 330 are still coupled to the VDDL voltage. As a result, a node 306 voltage will swing between VDDL and VSS, so that voltage levels shifting from high to low can be achieved. But on the other hand, because of the back biasing, the Vt of the PMOS transistor 320 or 330 is reduced, which will cause a high leakage current in the voltage level shifter 300, or even cause complete failure, if the PMOS transistor voltage is lower than the VSS voltage, and the PMOS transistors 320 and 330 cannot be turned off. Therefore, the application of the voltage level shifter 300 is limited to shifting between two fairly close voltage levels.

Referring to FIG. 3, the rest of the voltage level shifter 300 operates the same as the voltage level shifter 100, and it requires no further discussion.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A voltage level shifter with reduced layout area, comprising:
   an inverter including a first P-type metal-oxide-semiconductor (PMOS) transistor having a gate coupled to an input terminal, a source coupled to a first positive voltage (VDDL) and a first bulk formed within a Nwell coupled to a second positive voltage (VDD) which is higher than VDDL;
   a second PMOS transistor with its gate coupled to the inverter via an NMOS transistor, the second PMOS transistor has a source and a second bulk formed within said Nwell coupled to the VDD, and a drain coupled to an output node; and
   a third PMOS transistor having a gate coupled to the output node, a source and a third bulk formed within said Nwell coupled to the VDD, and a drain coupled to the gate of the second PMOS transistor, respectively, such that the VDDL voltage level at the input terminal is shifted to the VDD voltage level at the output node.

2. The voltage level shifter of claim 1 further comprising:
   a first N-type metal-oxide-semiconductor (NMOS) transistor having a gate, a drain and a source coupled to the input terminal, a drain of the first PMOS transistor and a complementary low voltage power supply (GND), respectively;
   a second NMOS transistor having a gate, a drain and a source coupled to the drain of the first NMOS transistor, a gate of the second PMOS transistor and the GND, respectively; and
   a third NMOS transistor having a gate, a drain and a source coupled to the input terminal, the output node and the GND, respectively.

3. The voltage level shifter of claim 2 further comprising an inverter having an input and an output coupled to the output node and an output terminal, respectively.

4. The voltage level shifter of claim 2, wherein the third PMOS transistor is serially connected to the second NMOS transistor.

5. A voltage level shifter with reduced layout area, comprising:
   a first inverter including a first P-type metal-oxide-semiconductor (PMOS) transistor having a gate coupled to an input terminal, a source coupled to a first positive voltage (VDDL) and a first bulk formed within a Nwell coupled to a second positive voltage (VDD) which is higher than the VDDL;
   a second PMOS transistor with its gate coupled to the inverter via an NMOS transistor, the second PMOS transistor has a drain coupled to an output node, and both a source and a second bulk formed within said Nwell coupled to the VDD;
   a third PMOS transistor having a gate coupled to the output node, a source and a third bulk formed within said Nwell coupled to the VDD, and a drain coupled to the gate of the second PMOS transistor, respectively; and a second inverter coupled between the drain of the second PMOS transistor and an output terminal (OUT), such that the VDDL voltage level at the input terminal is shifted to the VDD voltage level at the output node.

6. The voltage level shifter of claim 5 further comprising:

a first N-type metal-oxide-semiconductor (NMOS) transistor having a gate, a drain and a source coupled to the input terminal, a drain of the first PMOS transistor and a complementary low voltage power supply (GND), respectively;

a second NMOS transistor having a gate, a drain and a source coupled to the drain of the first NMOS transistor, a gate of the second PMOS transistor and the GND, respectively; and a third NMOS transistor having a gate, a drain and a source coupled to the input terminal, the output node and the GND, respectively.

7. The voltage level shifter of claim 6, wherein the inverter is coupled to the VDD and GND, respectively.

8. The voltage level shifter of claim 6, wherein the third PMOS transistor is serially connected to the second NMOS transistor.

* * * * *